(12) United States Patent
Phan et al.

(10) Patent No.: US 6,316,277 B1
(45) Date of Patent: Nov. 13, 2001

(54) TUNING SUBSTRATE/RESIST CONTRAST TO MAXIMIZE DEFECT INSPECTION SENSITIVITY FOR ULTRA-THIN RESIST IN DUV LITHOGRAPHY

(75) Inventors: Khoi A. Phan, San Jose; Christopher F. Lyons, Fremont; Khanh B. Nguyen, Sunnyvale; Jeff Schefske, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/580,612

(22) Filed: May 30, 2000

(51) Int. Cl.[7] ................................................. H01L 21/66
(52) U.S. Cl. ........................ 438/14; 438/16; 438/636; 438/313
(58) Field of Search ........................... 438/14, 16, 636; 430/313

(56) References Cited

U.S. PATENT DOCUMENTS

| | | | |
|---|---|---|---|
| 4,203,799 | * 5/1980 | Sugawara et al. | 156/601 |
| 5,450,205 | * 9/1995 | Sawin et al. | 356/382 |
| 5,564,830 | * 10/1996 | Bobel et al. | 374/126 |
| 5,695,556 | * 12/1997 | Tamamura et al. | 117/85 |
| 5,759,746 | * 6/1998 | Azuma et al. | 430/313 |
| 6,042,995 | * 3/2000 | White | 430/311 |

* cited by examiner

Primary Examiner—John F. Niebling
Assistant Examiner—Olivia T Luk
(74) Attorney, Agent, or Firm—Davis Chin

(57) ABSTRACT

There is provided a method for enhancing the contrast between oxide film and ultra-thin resists in deep-ultraviolet lithography for use with a wafer defect inspection system in order to maximize defect inspection sensitivity. This is achieved by varying the thickness of the oxide film for a given ultra-thin resist thickness so as to produce a high contrast. As a result, defect inspection of the ultra-thin resist pattern is easily obtained. In a second embodiment, the ultra-thin resist thickness is varied for a given oxide film thickness. In a third embodiment, both the oxide film and the ultra-thin resist thicknesses are varied simultaneously so as to obtain an optimum contrast.

6 Claims, 2 Drawing Sheets

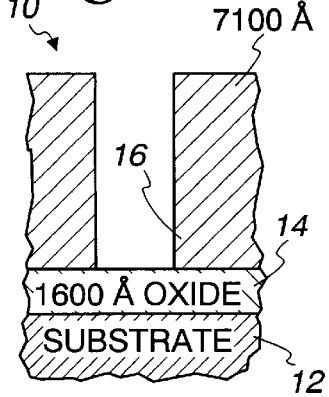
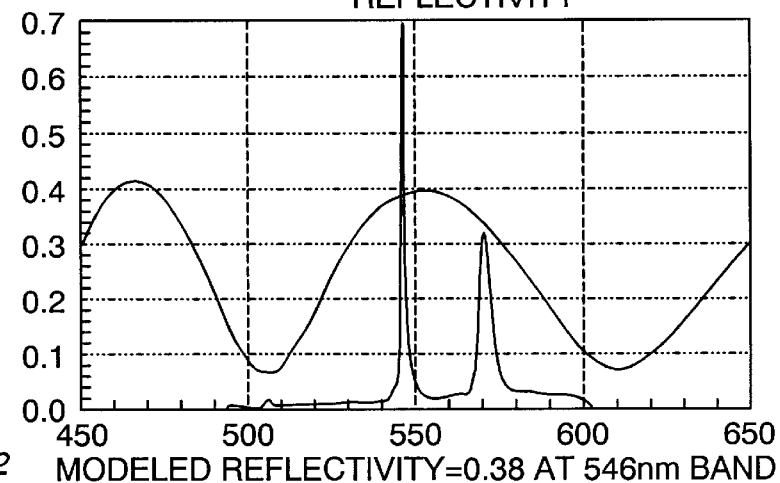
Fig. 1(a)
Fig. 1(b)
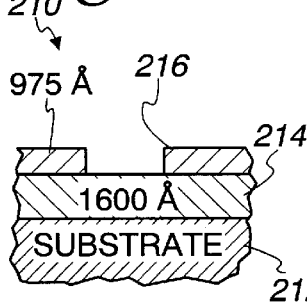
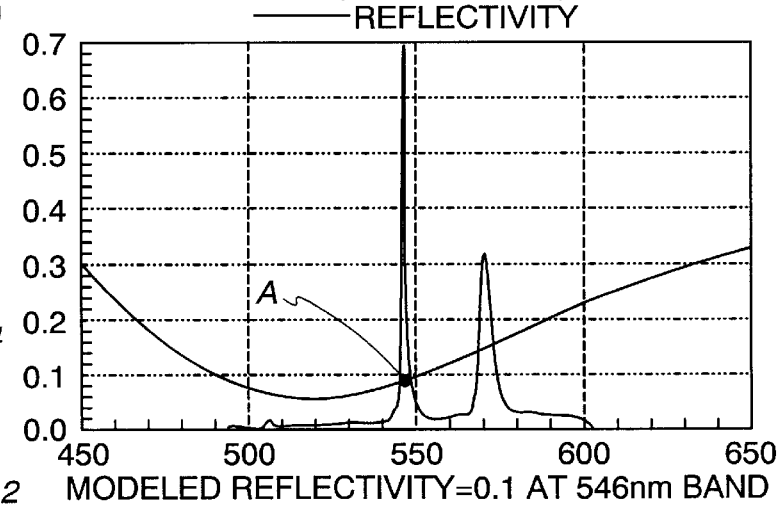
Fig. 2(a)
Fig. 2(b)
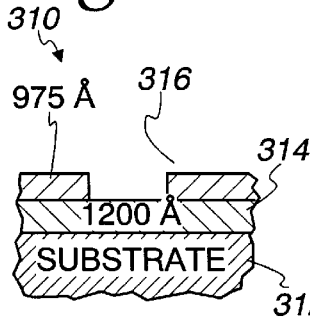
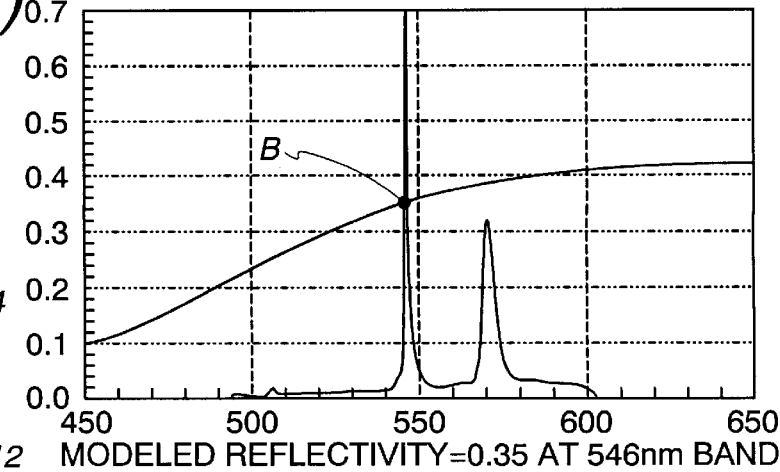
Fig. 3(a)
Fig. 3(b)

TUNING SUBSTRATE/RESIST CONTRAST TO MAXIMIZE DEFECT INSPECTION SENSITIVITY FOR ULTRA-THIN RESIST IN DUV LITHOGRAPHY

BACKGROUND OF THE INVENTION

This invention relates generally to wafer defect inspection systems. More particularly, it relates to a method for enhancing the contrast between oxide/substrate and ultra-thin resist on a semiconductor wafer for use with a wafer in deep ultraviolet (DUV) lithography defect inspection system in order to maximize defect inspection sensitivity.

As is generally well-known in the field of fabrication of semiconductor integrated circuits, a series or number of processes are required to be performed during the manufacturing of a semiconductor device. The overall fabrication process involves the patterning of a particular sequence of successive layers which are arranged to form the electrical components of the semiconductor device. The process of forming the integrated circuits on the surface of a single wafer of semiconductor material relies heavily on a "photolithographic or resist process" in which a resist coating is applied to the wafer, the wafer is then exposed, and thereafter the wafer is developed.

In the current state-of-the-art, integrated circuit manufacturers have been using in the resist process a resist coating having a standard photoresist thickness in the range of about 0.5 $\mu$m to 2.0 $\mu$m (5,000 Å–20,000 Å) which is applied to the surface of the silicon wafer. Typically, the wafer has an oxide layer with a standard thickness of about 1600 Å. Thus, during the defect inspection procedure where the wafer with the thicker resist coating thereon is placed into a defect inspection system, there was no difficulty in performing the defect inspection since there was a high contrast between the thicker resist coating and the oxide film thickness which can be optically detected by the defect inspection system. One type of wafer defect inspection system frequently used in the semiconductor industries is referred to as a "Brightfield defect inspection tool." Such a Brightfield inspection tool is commonly available from KLA-Tencor Corporation of San Jose, Calif., which is designated under their Model No. KLA 2132 for narrow-band illumination or KLA 2138 for broadband illumination.

However, as advances are being made at the present time in micro-lithographic processing and for the next generation lithography, there will be a trend toward using a resist coating having an ultra-thin resist (UTR) thickness in the regime of around 0.1 $\mu$m (1,000 Å), regardless of utilizing a KrF or ArF resist system. There are two main reasons why very thin resist applications will be required in the future. Firstly, there is a need to provide a greater resolution and to broaden or increase the small depth of focus associated with future exposure lenses (having a higher numerical aperture, shorter wavelength) in order for the lithographic process to be manufacturable. Secondly, there is a limitation on the penetration depth of light into the photoresist film by the resist chemistry (high absorption) at these shorter wavelengths (below 193 nm).

As semiconductor integrated circuit devices are being scaled down to deep submicron dimensions, it is known that defects originating in the micro-lithographic processes can become "killers" of the devices, thereby resulting in yield loss. Thus, a major concern in using ultra-thin resist (UTR) patterns is the existence of defects such as bubbles or pinholes which may damage or destroy the circuit pattern definition and thus will create a device failure or a lower yield level. Therefore, the most essential way of improving the yield is to detect and to monitor the defects in the UTR lithographic processes in order to maintain an acceptable yield level.

However, the defect detection procedure for multi-layer devices is quite difficult. As a result, a short loop defect monitor referred to sometimes as a "Photo Cell Monitor (PCM) or Photo Track Monitor (PTM)" is frequently utilized in the photolithographic area for inspection on the wafer inspection system, such as the KLA 2132 or KLA 2138. Unfortunately, this defect inspection tool being currently used has often encountered difficulties in performing the defect inspection on the UTR wafers. This defect inspection system uses a light source having a wavelength of 546 nm. The inspection difficulty results from the fact of the low contrast between the ultra-thin resist and the oxide film thickness at the inspection wavelength. The contrast is based upon the difference in the reflectivity of the ultra-thin resist and the reflectivity of the adjacent oxide film. These types of Brightfield defect inspection tools use an image subtraction technique where the video image at each pixel is compared to an adjacent pixel and a difference is calculated which is converted to a gray scale in order to detect the defects.

Therefore, it would be desirable to provide a method for enhancing the contrast between the oxide film thickness and the ultra-thin resist in DUV lithography so as to facilitate defect inspection. This is accomplished in one embodiment of the present invention by varying the oxide thickness for a given ultra-thin resist thickness so as to obtain an optimum contrast for a particular metrology or defect inspection system.

SUMMARY OF THE INVENTION

Accordingly, it is a general object of the present invention to provide a method for enhancing the contrast between oxide film and ultra-thin resist in DTV lithography on a semiconductor wafer.

It is an object of the present invention to provide a method for enhancing the contrast between oxide film and ultra-thin resist in DUV lithography on a semiconductor wafer so as to facilitate defect inspection.

It is another object of the present invention to provide a method for enhancing the contrast between oxide film and ultra-thin resist in DUV lithography with a thickness of less than 0.2 $\mu$m on a semiconductor wafer for use with a defect inspection system in order to maximize defect inspection sensitivity.

It is still another object of the present invention to provide a method for enhancing the contrast between oxide film and ultra-thin resist in DUV lithography on a semiconductor wafer which includes varying the thickness of the oxide for a given fixed resist thickness in order to obtain an optimum contrast therebetween.

In one preferred embodiment of the present invention, there is provided a method for enhancing the contrast between oxide film and ultra-thin resist on a semiconductor wafer in DUV lithography for use with a wafer defect inspection system so as to maximize defect inspection sensitivity. A semiconductor wafer is provided which has a standard oxide thickness and a standard resist thickness. The resist thickness is fixed. The thickness of the oxide is varied in order to obtain a reflectivity of the resist which is different from the reflectivity of the oxide film so as to produce an optimum contrast therebetween.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1(a) is a partial cross-sectional view of a semiconductor wafer having a standard oxide thickness (1600 Å) and a standard thicker resist thickness (7100 Å);

FIG. 1(b) is a graph of the reflectivity of the thicker resist on the semiconductor wafer with the standard oxide film thickness of FIG. 1(a);

FIG. 2(a) is a partial cross-sectional view of a semiconductor wafer having a standard oxide thickness (1600 Å) and a standard ultra-thin resist thickness (975 Å);

FIG. 2(b) is a graph of the reflectivity of the ultra-thin resist on the semiconductor wafer with the standard oxide thickness of FIG. 2(a);

FIG. 3(a) is a partial cross-sectional view of a semiconductor wafer having an oxide thickness of 1200 Å and an ultra-thin resist thickness of 975 Å;

FIG. 3(b) is a graph of the reflectivity of the ultra-thin resist/oxide film of FIG. 3(a);

DESCRIPTION OF THE PREFERRED EMBODIMENTS

Figures 4A, 4B:
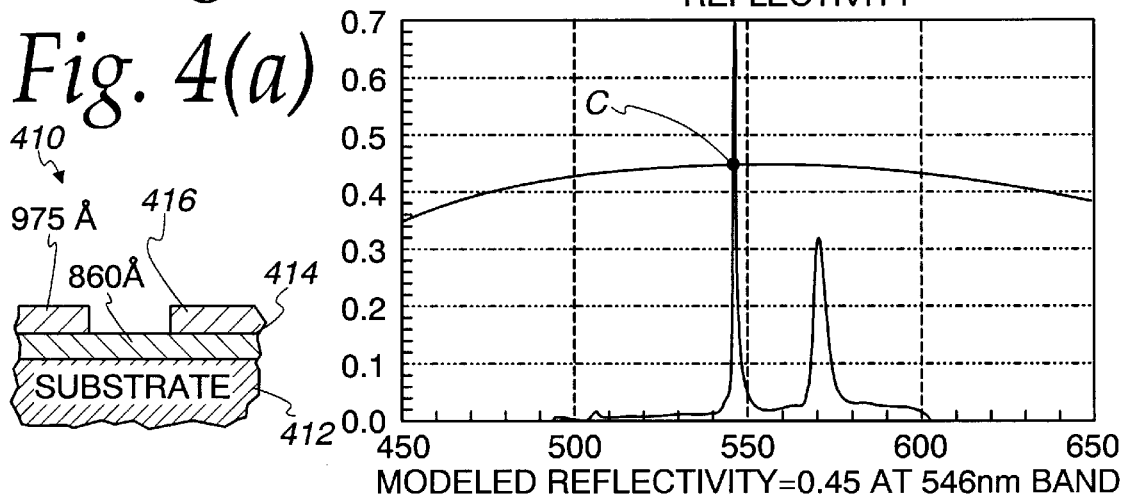
FIG. 4(a) is a partial cross-sectional view of a semiconductor wafer having an oxide thickness of 860 Å and an ultra-thin resist thickness of 975 Å.
FIG. 4(b) is a graph of the reflectivity of the ultra-thin resist/oxide film of FIG. 4(a)

One of the major concerns in the micro-lithographic processes used in the fabrication of semiconductor integrated circuit devices is the reduction of its yield due to defects in the resist patterns on the wafer. As previously pointed out, where a thicker resist coating (greater than 5,000 Å) is being used a wafer defect inspection system such as the KLA 2132 or KLA 2138 could perform the defect inspection without any problem since there was a good contrast between the thicker resist coating and the substrate/oxide film thickness. However, as the thickness of the resist coating in advanced micro-photolithographic technologies is being made smaller and smaller down below 0.18 μm (1800 Å) referred to as ultra-thin resist (UTR), such wafer defect inspection systems has experienced difficulties in detecting the defects, such as bubbles or pinholes, in the photoresist patterns due to the low contrast between the ultra-thin resist and the oxide film thickness.

The purpose of the present invention is to provide a method of enhancing the contrast between the oxide film and the ultra-thin resist in DUV lithography so as to facilitate defect inspection. In view of this, the inventors have discovered a way of achieving higher contrast by patterning the ultra-thin resist on different oxide thicknesses. Therefore, the wafer defect inspection system can easily locate the defects in the ultra-thin resist patterns with maximum defect sensitivity, thereby reducing the amount of inspection time expended.

Before describing in detail the method of the present invention for enhancing the contrast between the oxide film and the ultra-thin resist, it is believed that it would be helpful in understanding the principles of the present invention and to serve as a background by providing initially a brief explanation of the photo-lithographic process.

At the outset, it should be understood that measuring the variability of the defects for multi-layer devices is achieved by utilizing a short-loop monitoring process (PCM or PTM) which is essential in controlling the quality of the lithographic process for the semiconductor devices. One of the methodologies used to characterize and monitor the complete micro-lithographic processing is where most of the resist is exposed, thereby leaving behind a developed pattern of resist lines. In particular, first a resist is applied to a blank, unused silicon wafer. Then, the resist is exposed with a reticle possessing a repeatable x-y pattern at an optimized exposure energy and focus setting. Thereafter, there is provided a development step where a pattern of resists is left behind. Next, this patterned resist wafer can be sampled and reviewed by the wafer defect inspection system in order to determine the defects. A conventional resist process for fabricating a semiconductor integrated circuit device will now be explained below with reference to FIG. 1(a).

As can be seen from FIG. 1(a), during a conventional resist process for fabricating a semiconductor integrated circuit device, a semiconductor wafer 10 includes a substrate 12, an oxide film layer 14, and a thicker photoresist 16. This structure is formed by depositing the oxide film layer 14 over the substrate 12 on the semiconductor wafer 10 and then applying the thicker photoresist 16 on top of the oxide film layer 14. Next, the photoresist is exposed, developed and patterned lithographically so as to provide a plurality of small parallel photoresist lines with portions of the oxide layer 16 exposed between the adjacent lines. In one example, the standard oxide film layer has a thickness of approximately 1600 Å and the thicker photoresist has a standard thickness of 7100 Å.

Referring now to FIG. 1(b), there is shown a graph of the reflectivity of the thicker resist (7100 Å) on the semiconductor wafer with the oxide film thickness of 1600 Å of FIG. 1(a). The defect inspection system uses typically a light source having an inspection wavelength of 546 nm for defect inspection. As will be noted, at the spectral peak of 546 nm the reflectivity is 0.38 for the thicker resist/oxide. Thus, the thicker resist 16 is more reflective than the adjacent oxide 14 which results in a high contrast that can be optically detected by the defect inspection system. This illustrates that for thicker resists there is no problem with obtaining good contrast.

On the other hand, when an ultra-thin resist (UTR) 216 having a thickness of, for example, 975 Å is used on a semiconductor wafer 210 with the oxide film layer 214 of 1600 Å as illustrated in FIG. 2(a), the reflectivity of the UTR wafer is substantially reduced at the inspection wavelength of 546 nm. This is illustrated in FIG. 2(b) which is a graph of the reflectivity of the ultra-thin resist layer 216 of 975 Å thickness on the semiconductor wafer with the oxide film layer 14 of 1600 Å. It will be noted that the reflectivity is only 0.1 at the inspection wavelength of 546 nm. This results in a low contrast which makes defect inspection very difficult.

Referring now to FIGS. 3 through 5, there will be described a method of the present invention for enhancing contrast between the oxide film and the ultra-thin resist on a semiconductor wafer in DUV lithography so as to maximize defect inspection sensitivity. Initially, it is assumed that there is provided a semiconductor test wafer for Photo Track Monitor (PTM) which has a standard resist thickness and a standard oxide thickness. In this instance, the standard ultra-thin resist (UTR) thickness is selected to be 975 Å and the standard oxide thickness is selected to be 1600 Å. This test wafer will then be examined by the wafer defect inspection system to determine if the contrast has been optimized. If it is not optimized, the UTR thickness is fixed and will not be changed. Then, the oxide thickness is varied. A test wafer with this fixed resist thickness and changed oxide thickness will be examined again by the defect inspection system to determine whether the contrast has been increased over the test wafer with the standard UTR and oxide thicknesses. These steps will be repeated over and over until an optimal thickness for the oxide is found which produces the highest contrast.

In FIG. 3(a), there is shown a silicon wafer 310 which includes a fixed UTR thickness 316 of 975 Å and an oxide film 314 which is varied to an optimum thickness of 1200 Å. In FIG. 3(b), there is a graph of the reflectivity of the structure in FIG. 3(a). It can be seen that the reflectivity has been increased or enhanced to 0.35 at 546 nm (point B) as compared to the 0.1 at point A in FIG. 2(b). Further, by varying further the oxide thickness there was found to be two other optimum oxide thicknesses of 860 Å and 2,750 Å for the fixed UTR of 975 Å for the Photo Track Monitor.

Figures 5A, 5B:
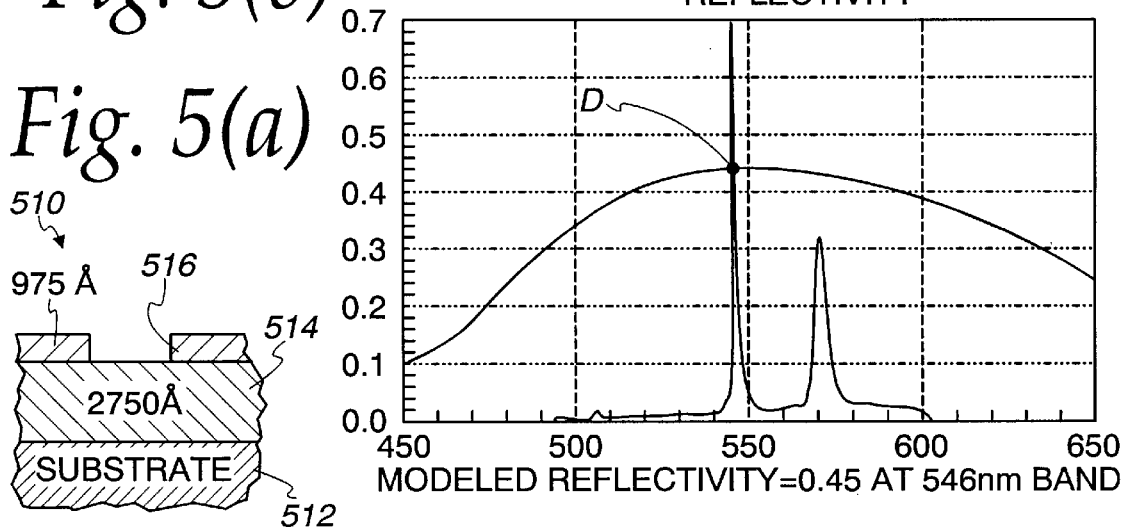
FIG. 5(a) is a partial cross-sectional view of a semiconductor wafer having an oxide thickness of 2750 Å and an ultra-thin resist thickness of 975 Å.
FIG. 5(b) is a graph of the reflectivity of the ultra-thin resist/oxide film of FIG. 5(a)

In FIG. 4(a), there is shown a semiconductor wafer 410 having a fixed UTR thickness 416 of 975 Å and an oxide film 414 which is varied to an optimal thickness of 860 Å. In FIG. 4(b), there is a graph of the reflectivity of the structure in FIG. 4(a). It can be seen that the reflectivity has been increased to 0.45 at 546 nm (point C). Similarly, in FIG. 5(a), there is shown a semiconductor wafer 510 having a fixed UTR thickness 516 of 975 Å and an oxide film 514 which is varied to an optimal thickness of 2,750 Å. In FIG. 5(b), there is a graph of the reflectivity of the structure in FIG. 5(a). Again, it will be noted that the reflectivity has been enhanced to 0.45 at the wavelength of 546 nm (point D).

Figure 6:
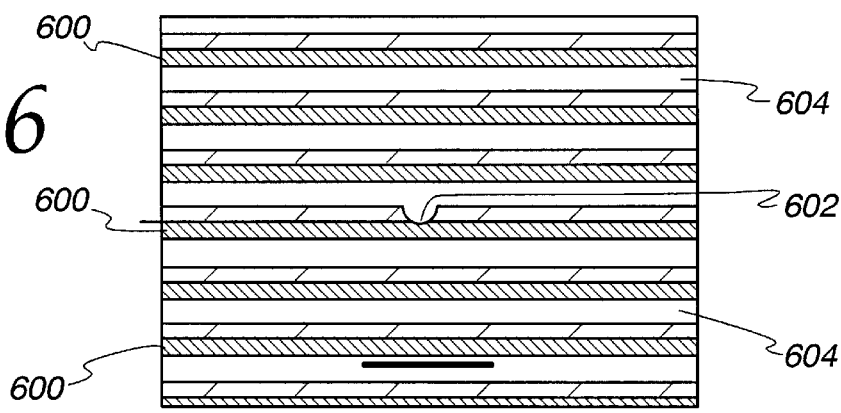
FIG. 6 is a SEM photograph of an example of a resist defect which is obtained utilizing the method of the present invention, the oxide film thickness being optimized for a given ultra-thin resist to provide high contrast.

In FIG. 6, there is depicted a SEM photograph of the ultra-thin photoresist patterned lines 600 in which one of them has a resist defect consisting of a micro-notch 602 which is found by utilizing the method of the present invention in order to obtain a high contrast. This high contrast is due to the difference in the reflectivity of the ultra-thin resist lines 600 and the reflectivity of the adjacent oxide 604. In this case, the thickness of the UTR 600 was 975 Å for a KrF resist system, and the oxide thickness was 1200 Å.

Alternatively, in accordance with a second method of the present invention, the oxide thickness is fixed and then the ultra-thin resist thickness is varied in order to obtain an optimal contrast. In still another third embodiment of the present invention, both the oxide thickness and the resist thickness are varied simultaneously so as to achieve the optimal results.

From the foregoing detailed description, it can thus be seen that the present invention provides a method for enhancing the contrast between oxide film and ultra-thin resists on a semiconductor wafer in DUV lithography so as to facilitate defect inspection. This is achieved by fixing the thickness of the ultra-thin resist and varying the thickness of the oxide film in order to produce a high contrast therebetween. As a result, the defect inspection of the ultra-thin photoresist pattern in deep-ultraviolet lithography can be easily obtained on a more efficient and effective basis.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A method for enhancing the contrast between oxide film and ultra-thin resists on a semiconductor wafer in DUV lithography for use with a wafer defect inspection system in order to maximize defect inspection sensitivity, said method comprising the steps of:

providing a semiconductor wafer having a standard oxide film thickness of about 1600 Å and a standard ultra-thin resist thickness of 1000 Å or less;

fixing said ultra-thin resist thickness; and varying the thickness of the oxide film in order to obtain a reflectivity of the ultra-thin resist which is different from the reflectivity of the oxide film so as to produce a high contrast therebetween.

2. A method for enhancing as claimed in claim 1, wherein said ultra-thin resist has a fixed thickness of 975 Å and said oxide film thickness is varied to a thickness of 1200 Å to produce an optimal contrast.

3. A method for enhancing as claimed in claim 1, wherein said ultra-thin resist has a fixed thickness of 975 Å and said oxide film thickness is varied to a thickness of 860 Å to produce an optimal contrast.

4. A method for enhancing as claimed in claim 1, wherein said ultra-thin resist has a fixed thickness of 975 Å and said oxide film thickness is varied to a thickness of 2,750 Å to produce an optimal contrast.

5. A method for enhancing the contrast between oxide film and ultra-thin resists on a semiconductor wafer in DUV lithography for use with a wafer defect inspection system in order to maximize defect inspection sensitivity, said method comprising the steps of:

providing a semiconductor wafer having a standard oxide film thickness of about 1600 Å and a standard ultra-thin resist thickness of 1000 Å or less;

fixing said oxide film thickness; and varying the thickness of the ultra-thin resist in order to obtain a reflectivity of the ultra-thin resist which is different from the reflectivity of the oxide film so as to produce a high contrast therebetween.

6. A method for enhancing the contrast between oxide film and ultra-thin resists on a semiconductor wafer in DUV lithography for use with a wafer defect inspection system in order to maximize defect inspection sensitivity, said method comprising the steps of:

providing a semiconductor wafer having a standard oxide film thickness of about 1600 Å and a standard ultra-thin resist thickness of 1000 Å or less;

varying said ultra-thin resist thickness; and varying simultaneously the thickness of the oxide film in order to obtain a reflectivity of the ultra-thin resist which is different from the reflectivity of the oxide film so as to produce a high contrast therebetween.

* * * * *

UNITED STATES PATENT AND TRADEMARK OFFICE
CERTIFICATE OF CORRECTION

PATENT NO. : 6,316,277 B1
DATED : November 13, 2001
INVENTOR(S) : Khoi A. Phan et al.

Page 1 of 1

It is certified that error appears in the above-identified patent and that said Letters Patent is hereby corrected as shown below:

Column 6,
Line 20, change "of about" to -- substantially equal to --;
Line 20, after "1600Å", insert -- for a DUV wavelength for defect monitoring --.
Line 24, after "resist", insert -- optimized at an inspection wavelength for the wafer defect inspection system --.
Line 46, change "of about" to -- substantially equal to --;
Line 46, after "1600Å", insert -- for a DUV wavelength for defect monitoring --.
Line 50, after "resist", insert -- optimized at an inspection wavelength for the wafer defect inspection system --.
Line 59, change "of about" to -- substantially equal to --;
Line 59, after "1600Å", insert -- for a DUV wavelength for defect monitoring --.
Line 63, after "resist", insert -- optimized at an inspection wavelength for the wafer defect inspection system --.

Signed and Sealed this

Twenty-third Day of April, 2002

Attest:

JAMES E. ROGAN
*Attesting Officer*   *Director of the United States Patent and Trademark Office*